United States Patent
Shin

(10) Patent No.: US 6,414,901 B1
(45) Date of Patent: Jul. 2, 2002

(54) CIRCUIT FOR GENERATING ADDRESS OF SEMICONDUCTOR MEMORY DEVICE

(75) Inventor: Youn Cherl Shin, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/906,108

(22) Filed: Jul. 17, 2001

(30) Foreign Application Priority Data

Jul. 19, 2000 (KR) .......................................... 2000-41371

(51) Int. Cl.$^7$ ................................................. G11C 8/00
(52) U.S. Cl. .................... 365/230.08; 365/200; 365/222
(58) Field of Search ....................... 365/230.08, 230.06, 365/189.04, 236, 222, 200, 201

(56) References Cited

U.S. PATENT DOCUMENTS 5,325,333 A  *  6/1994  Sato ............................ 365/200
5,434,814 A  *  7/1995  Cho et al. ............... 365/185.13
6,134,179 A  * 10/2000  Ooishi ......................... 365/200

* cited by examiner

Primary Examiner—Son L. Mai
Assistant Examiner—Gene N. Auduong
(74) Attorney, Agent, or Firm—Birch, Stewart, Kolasch & Birch, LLP

(57) ABSTRACT

A circuit for generating an address of a semiconductor memory device which improves usage yield of the semiconductor memory device. The memory device includes circuitry to detect errors of various sections of a memory chip. After detecting the error-prone sections, the remainder of the memory chip can be used instead of discarding the entire memory device.

14 Claims, 9 Drawing Sheets

CIRCUIT FOR GENERATING ADDRESS OF SEMICONDUCTOR MEMORY DEVICE

FIELD OF THE INVENTION

The present invention relates to a semiconductor memory device, and more particularly, to a circuit for generating an address of a semiconductor memory device, which improves usage yield of the semiconductor memory device.

BACKGROUND OF THE INVENTION

A related art circuit for generating an address of a semiconductor memory device will be described with reference to the accompanying drawings.

FIG. 1 is a block diagram showing a related art circuit for generating an address of a semiconductor memory device, FIG. 2 shows a refresh counting unit of FIG. 1, and FIG. 3 shows an address switching unit of FIG. 1.

As shown in FIG. 1, the related art circuit for generating an address of a semiconductor memory device includes a refresh counting unit 11 outputting an n-bit refresh address BX signals in response to a refresh enable signal REN to refresh an address; an address buffer 13 outputting an n-bit input address AX signals in response to an external address EXa; and an address switching unit 13 selecting either the BX or the AX signals and outputting bank address and internal address (BA & Int) signals in response to the REN signal.

As shown in FIG. 2, the refresh counting unit 11 includes n refresh counters $20_0$ to $20_{n-1}$ outputting BX signals BX[0] to BX[n-1], respectively, to the address switching unit 13 when enabled by the refresh enable signal REN. The refresh counters $20_0$ to $20_{n-2}$ also output carry signals $C_0$ to $C_{n-2}$, where each carry signal is received by the respective higher order bit neighboring refresh counters $20_1$ to $20_{n-1}$.

The address switching unit 13, as shown in FIG. 3, includes n switches $30_0$ to $30_{n-1}$ to select either the n-bit BX or AX signals to output as internal addresses Int[0] to Int[n-1]. The selection is performed in response to the refresh enable REN signal.

The operation of the aforementioned related art circuit for generating an address of a semiconductor memory device will be described below.

When no refresh operation takes place, i.e., when the REN is disabled, the address switching unit 13 selects the AX signals from the address buffer 12 to be output as the Int signals. However, when the refresh operation does take place, i.e., when the REN is enabled, the address switching unit 13 selects the BX signals from the refresh counting unit 11.

The above mentioned related art circuit for generating an address of a semiconductor memory device has at least the following problem. When there are errors in any part of the memory device, the entire device must be discarded. This is even if a majority of the sections of the device may be properly functioning. This reduces the usage yield of the semiconductor memory device since the usable sections of the memory are also discarded, and thus increases the production cost due to the unnecessary discarding of useful devices.

SUMMARY OF THE INVENTION

An object of the invention is to solve at least the above problems and/or disadvantages and to provide at least the advantages described hereinafter.

Another object of the present invention is to provide a circuit for generating an address of a semiconductor memory device that substantially obviates one or more of the problems due to limitations and disadvantages of the related art.

Another object of the present invention is to provide a circuit for generating an address of a semiconductor memory device, which improves yield of the semiconductor memory device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve at least these objects and other advantages in a whole or in part and in accordance with purposes of the present invention, as embodied and broadly described, a circuit for generating an address of a semiconductor memory device includes a half chip enable unit receiving a half chip enable signal for allowing a memory cell having a defect to be constructed by a half chip; a refresh counting unit generating a refresh address in response to an external refresh enable signal and the half chip enable signal; an address buffer receiving an external address and generating an input address; an address switching unit selectively outputting one of the refresh address and the input address as an internal address in response to the refresh enable signal and the half chip enable signal; a block fail determining unit outputting a block fail signal data indicating a poor memory cell in response to the half chip enable signal; and a bank address coding unit generating a bank address using the refresh address and performing a logic operation of an output signal of the block fail determining unit and a bank address when the half chip enable signal is enabled in a half chip operation, to output the logic operated signal to a coded bank address of the defected memory cell.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiment of the present invention, examples of which are illustrated in the accompanying drawings.

Figure 1:
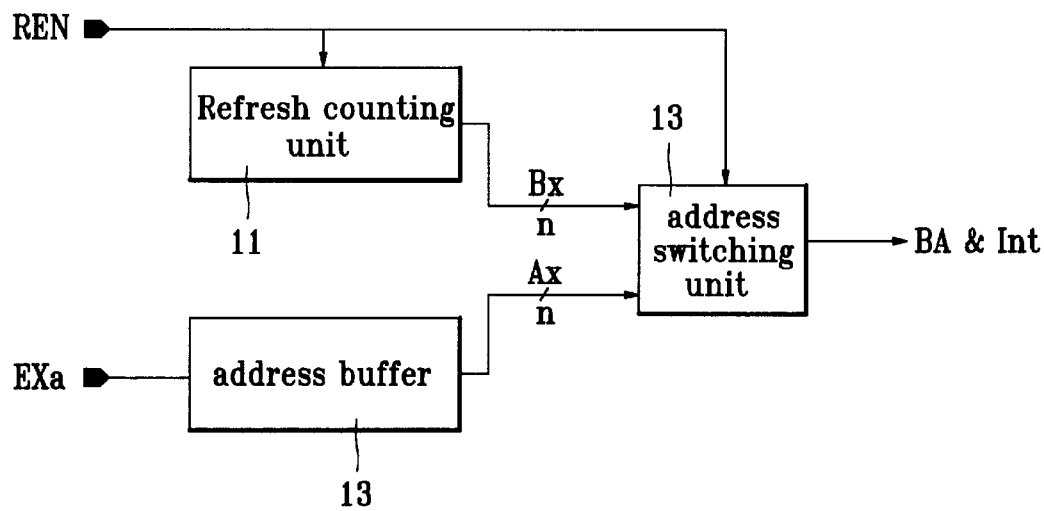
FIG. 1 is a block diagram showing a related art circuit for generating an address of a semiconductor memory device.
Figure 2:
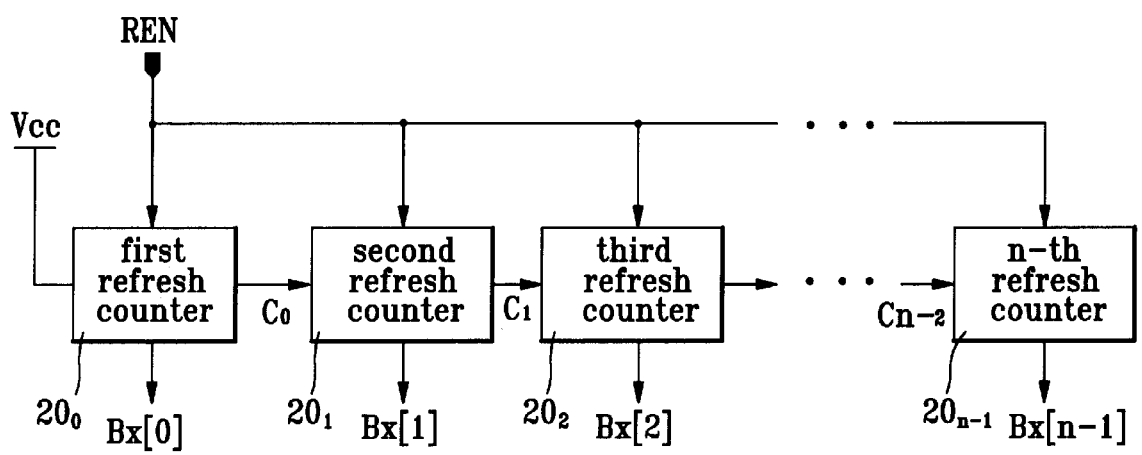
FIG. 2 is a detailed diagram showing a refresh counting unit of FIG. 1.
Figure 3:
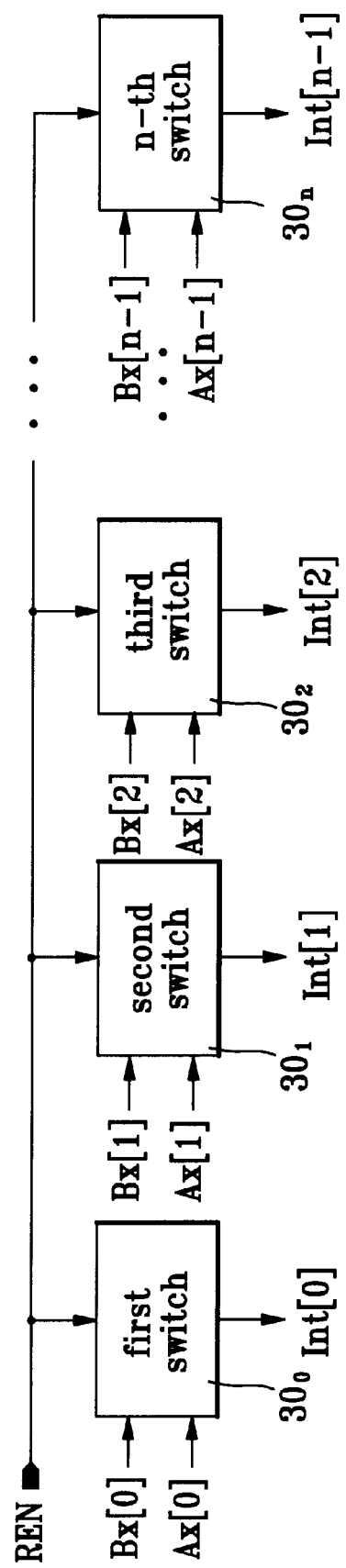
FIG. 3 is a detailed diagram showing an address switching unit of FIG. 1.
Figure 4:
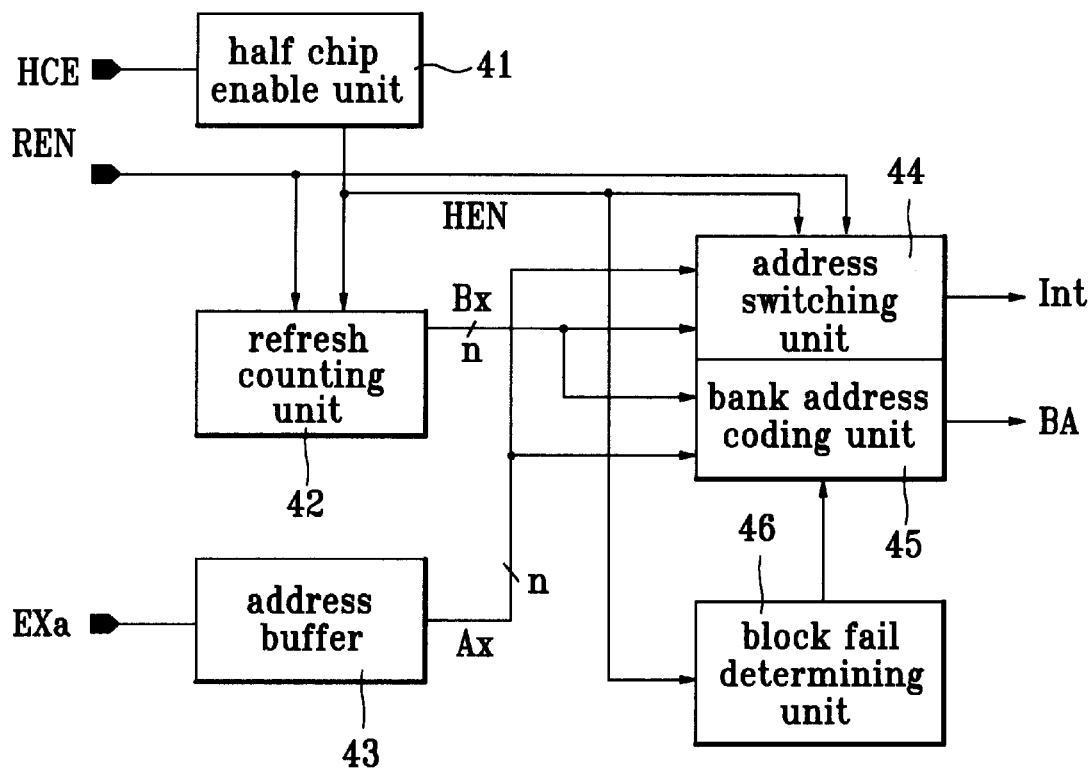
FIG. 4 is a block diagram showing a circuit for generating an address of a semiconductor memory device according to an embodiment of the present invention.

As shown in FIG. 4, a circuit for generating an address of a semiconductor memory device according to an embodiment of the present invention includes a half chip enable unit 41, a refresh counting unit 42, an address buffer 43, an address switching unit 44, a bank address coding unit 45, and a block fail determining unit 46.

Figure 5:
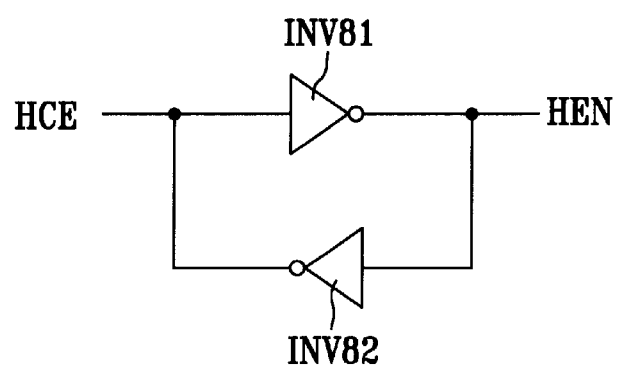
FIG. 5 is a detailed diagram showing a half chip enable unit.

The half chip enable unit 41 receives an external half chip enable signal HCE and outputs an internal half chip enable signal HEN. As shown in FIG. 5, the half chip enable unit includes two inverters INV81 and INV82. Inverter INV81 is connected to inverter INV82 such that the input of inverter INV81 is coupled to the output of INV82 and the input of inverter INV82 is coupled to the output of inverter INV81. During operation, the half chip enable unit 41 latches an external half chip enable signal HCE to be output to an internal half chip enable signal.

The refresh counting unit 42 generates n-bit refresh address signals BX in response to a refresh enable signal REN to refresh an address. The address buffer 43 receives an external address EXa and outputs n-bit input address signals AX.

Figure 6:
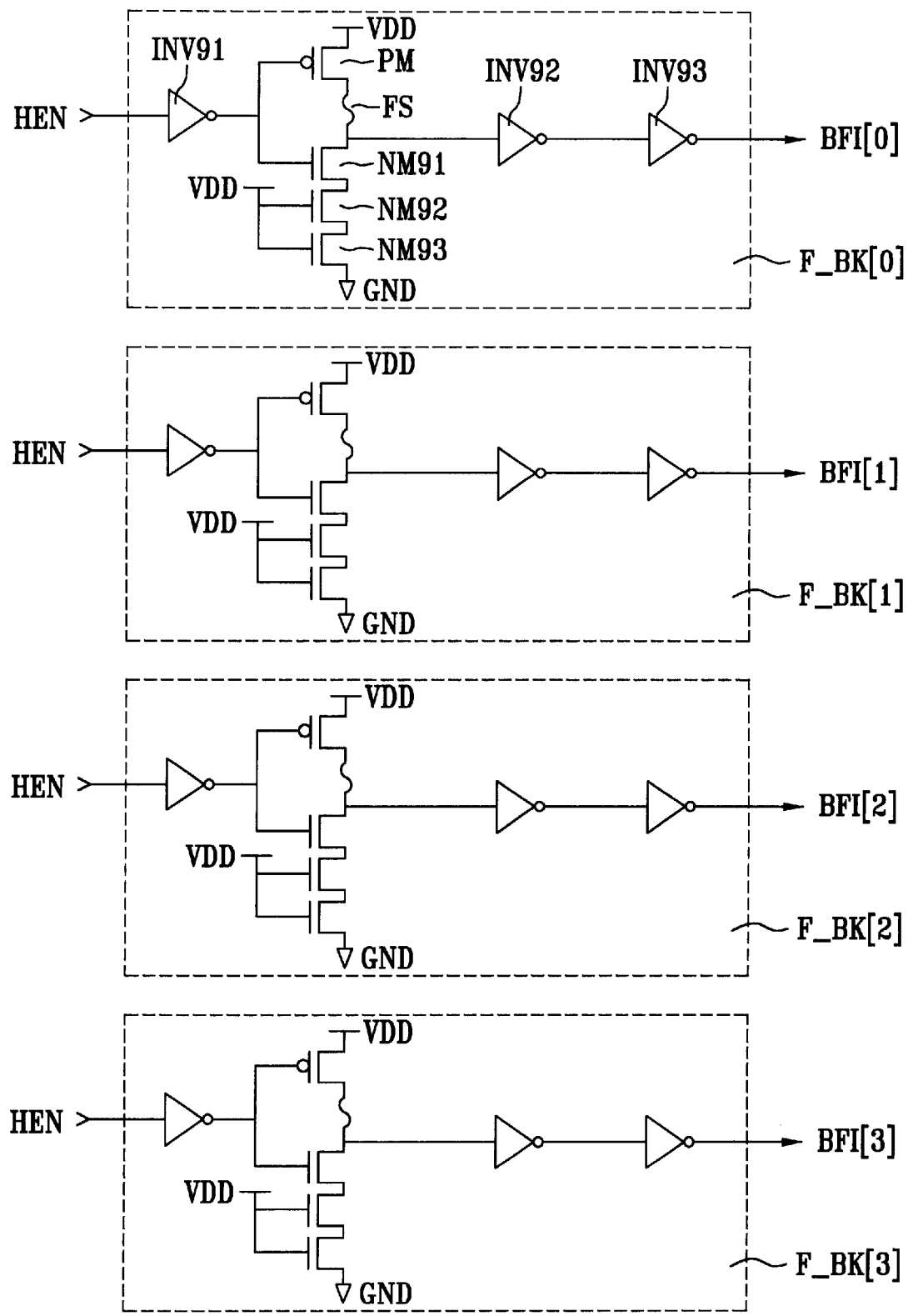
FIG. 6 is a detailed diagram showing a block fail determining unit.

The block fail determining unit 46 stores errors, for example when an error occurs during a chip test, and outputs a block fail signal BFI when the internal half chip enable signal HEN is enabled. As shown in FIG. 6, the block fail determining unit 46 includes inverters INV91, INV92 and INV93, fuse FS, PMOSFET PM, NMOSFETs NM91, NM92 and NM93. The half chip enable signal HEN is received by inverter INV91. The output of the inverter INV91 is connected to the PMOSFET PM and the NMOSFET 91. The drain of PMOSFET PM is connected to an input voltage VDD and the source is connected to fuse FS. NMOSFETs NM91, NM92 and NM93 are connected in series with NMOSFET NM91 connected to NMOSFET NM92 and NMOSFET NM92 connected to NMOSFET NM93. The source of NMOSFET NM93 is connected to a ground GND. Additionally, an input voltage VDD is connected to the substrate of NMOSFETs NM92 and NM93. Inverter INV92 is connected to the output of fuse FS and drain of NMOSFET NM91. Inverter INV92 is connected in series with Inverter INV93.

During operation, the block fail determining unit 46 stores defect data of a block within each bank in fuse FS and outputs the defect data as a bank fail signal BFI when the half chip enable unit 41 is enabled.

Figure 9:
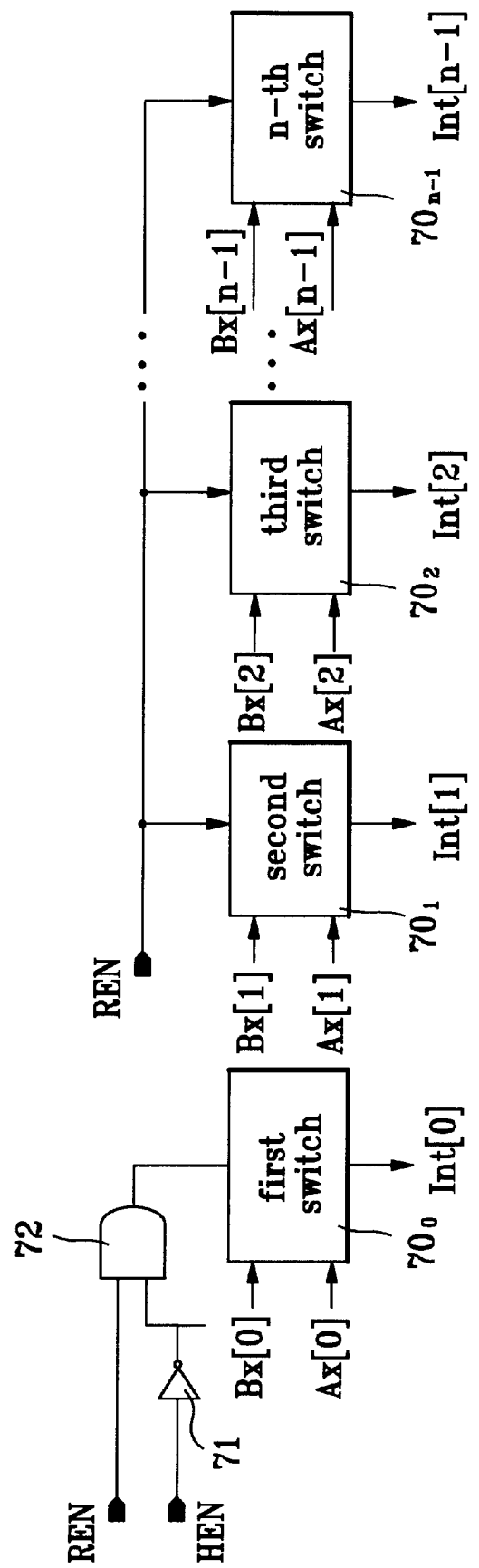
FIG. 9 is a detailed diagram showing an address switching unit of FIG. 4.

Since the block fail signal BFI represents fail data of a block within each bank, the block fail signal outputs four bits BFI[0] to BFI[3], as shown in FIG. 9, each corresponding to a bank if one memory cell is divided into four banks. Accordingly, if a memory cell is divided into four or more banks, the bit number of the block fail signal increases by the number of increased banks. Also, the bit number of coded bank addresses BA of the bank address coding unit 46 increases.

Figure 7A:
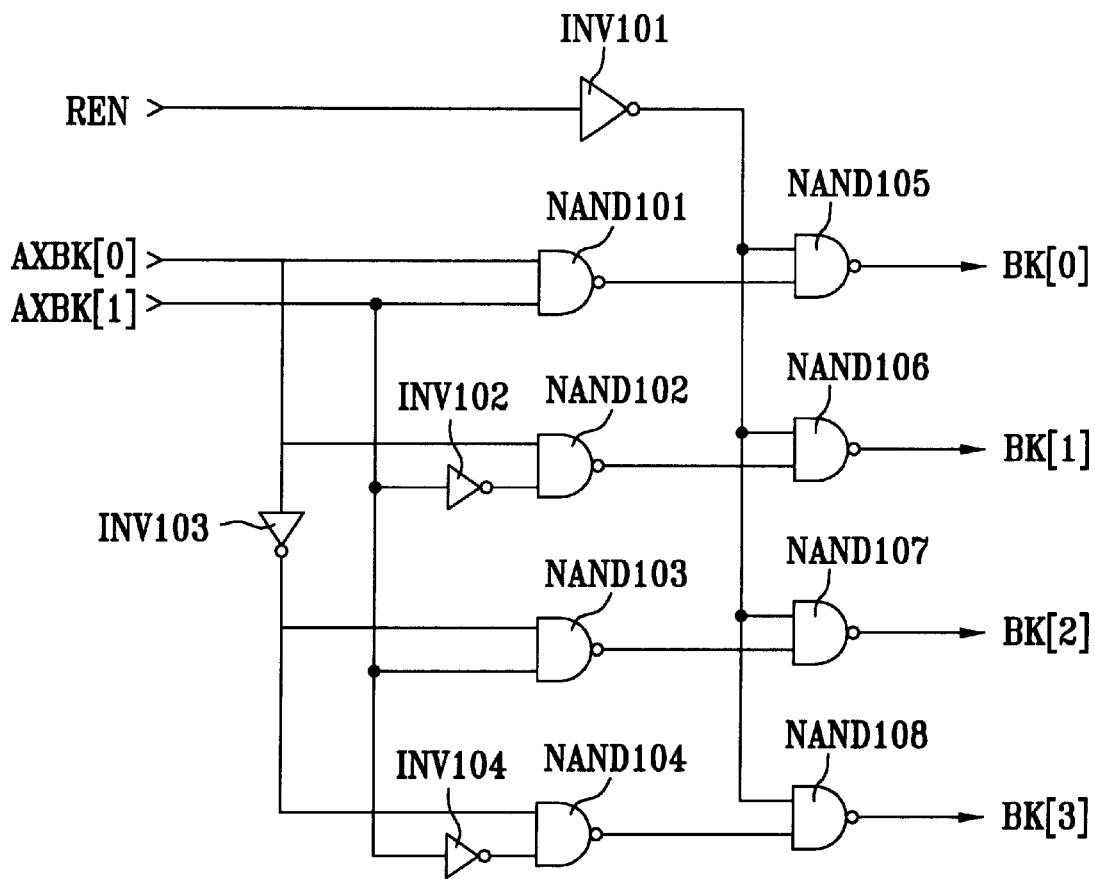
FIGS. 7A and 7B are detailed diagrams showing a first decoder and a second decoder of the bank address coding unit, respectively.
Figure 7B:
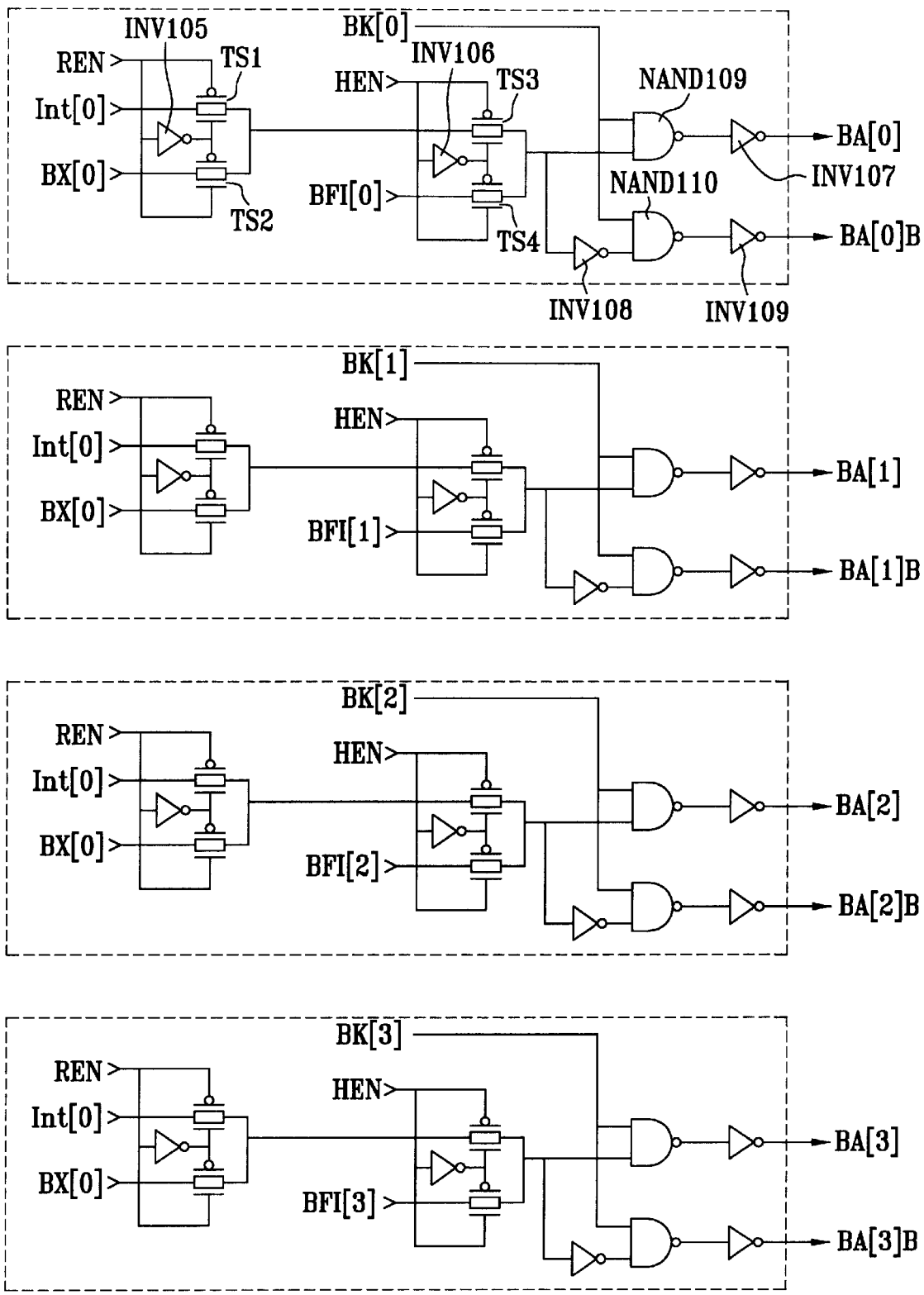

The bank address coding unit 45 codes the BFI signal and either the BX signal or the AX signal to output the coded signal as a bank address signal BA. The bank address coding unit is composed of a first decoder unit, as shown in FIG. 7A, and a second decoder unit, as shown in FIG. 7B. The first decoder unit includes an inverter INV101, which receives refresh enable signal and has an output connected to first gates NAND105, NAND106, NAND107 and NAND108. The first decoder also has four second gates NAND101, NAND102, NAND103 and NAND104, which each receive two addresses of AX signals such as AXBK[0], AXBK[1]. However, the AX signal associated with address AXBX[0] passes through inverter INV103 prior to being received by gate NAND104 and the AX signal associated with address AX BK[1] passes through an inverter prior to being received by gates NAND102 and NAND104. The output of each of the second gates NAND101, NAND102, NAND103 and NAND104 is connected to a first gate NAND 105, NAND 106, NAND107 and NAND108, respectively, so that one first gate is connected to one second gate. Each first gate NAND105, NAND106, NAND107 and NAND108 outputs a bank address such as BK[0] to BK[3], respectively.

As shown in FIG. 7B, the second decoder has two first transmission gates TS1 and TS2; two second transmission gates TS3 and TS4; inverters INV105, INV106, INV107, INV108 and INV109; and two gates NAND109, NAND110. The first transmission gates TS1 and TS2 are connected to the refresh enable signal REN, inverter INV105 and Int signals Int[0] and BX signal BXD[0]. The outputs of transmission gates TS1 and TS2 are connected to second transmission gates TS3 and TS4, which are also connected to the half chip enable signal and block fail signal BFI[0]. Additionally, inverter INV106 is connected between transmission gates TS3 and TS4. Gates NAND109 and NAND110 receive input from transmission gates TS3 and TS4, but inverter INV108 inverts the signal prior to gate NAND110. Gates NAND109 and NAND110 also receive bank address BK[0] from the first decoder shown in FIG. 7A. Inverters INV107 and INV109 invert the signal output by gates NAND109 and NAND110, and output decoded bank addresses BA[0] and BA[0]B.

During half chip operation, the second decoder decodes the bank fail signal BFI and the bank address BK, and outputs a decoded bank address BA. During normal and refresh operations, the second decoder decodes the AX signals and the bank address BK with a full chip, to output a decoded bank address BA.

Figure 8:
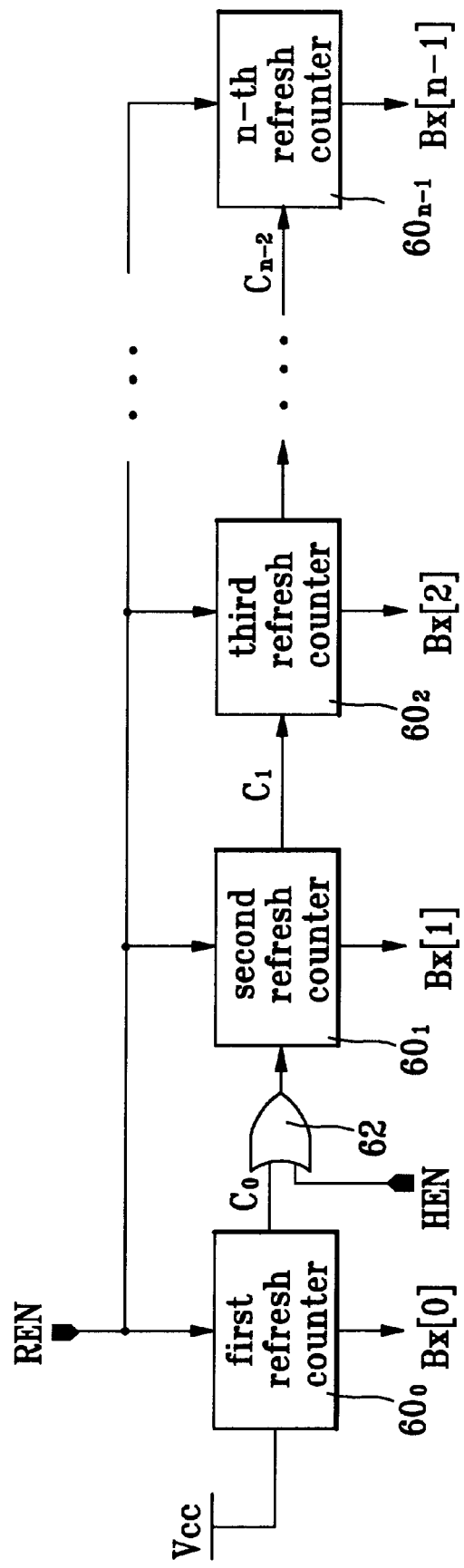
FIG. 8 is a detailed diagram showing a refresh counting unit of FIG. 4.

As shown in FIG. 8, the refresh counting unit 42 includes n refresh counters $60_0$ to $60_{n-1}$ and an OR gate 62. The refresh counters output n-bit BX signals (BX[0] to BX[n-1]) to the address switching unit 44 and the bank address coding unit 45 when enabled by the refresh enable signal REN. All refresh counters are enabled and disabled simultaneously.

The first refresh counter $60_0$ also outputs a carry signal $C_O$ and fed to an input of the OR gate 62. The OR gate 62 also takes as input the half chip enable signal HEN and outputs the result of OR'ing the $C_O$ and HEN signals. The output of the OR gate 62 is fed to the second refresh counter $60_1$. The refresh counters $60_1$ to $60_{n-2}$ also generate carry signals $C_1$ to $C_{n-2}$ that are fed to the respective higher order refresh counters $60_2$ to $60_{n-1}$.

The address switching unit 44 selects either the BX signals or the AX signals in response to the refresh enable signal REN, and outputs the selected signal as n-bit internal address Int signals. As shown in FIG. 9, the address switching unit 44, includes an inverter 71, an AND gate 72, and n switches $70_0$ to $70_{n-1}$. The switches output the n-bit Int signals (Int[0] to Int[n-1]) by selecting either the BX or the AX signals in response to an enabling signal. The enabling signal for the first switch $70_0$ is the output of the AND gate 72 and the enabling signal for the remaining switches $70_1$ to $70_{n-1}$ is the REN signal.

The inverter 71 inverts the internal half chip enable signal HEN and the AND gate 72 performs an AND operation of the refresh enable signal REN and the inverted half chip enable signal. The output of the AND gate 72 is used to select either the BX[0] signal or the AX[0] signal by the first switch $70_0$.

The remaining switches $70_1$ to $70_{n-1}$ output the remaining BX or AX signals as Int[[1]–Int[n–1], respectively, in response to the refresh enable signal.

The operation of the circuit for generating an address of a semiconductor memory device according to the embodiment of the present invention will now be described.

When no errors occur in the chip, such as during a test operation, the internal half chip enable signal HEN is disabled, and thus the block fail determining unit 46 does not generate the block fail signal BFI. At this time, if the refresh enable signal REN is enabled, the address switching unit 44 selects BX signals to be outputted as the Int signals. Also, the bank address coding unit 45 codes the BX signals to output the bank address BA.

On the other hand, if the refresh enable signal REN is disabled when the block fail signal BFI is not generated, the address switching unit 44 selects the AX signals to be outputted as the Int signals, and the bank address coding unit 45 codes the AX signals to output the bank address BA.

When an error occurs on the chip, the half chip enable unit 41 outputs the internal half chip enable signal HEN in response to the external half chip enable signal HCE. Subsequently, the internal half chip enable signal HEN enables the block fail determining unit 46. The block fail determining unit 46 codes the failure, such as errors that occur while testing the chip, and outputs the coded data as the block fail signal BFI.

Figure 10:
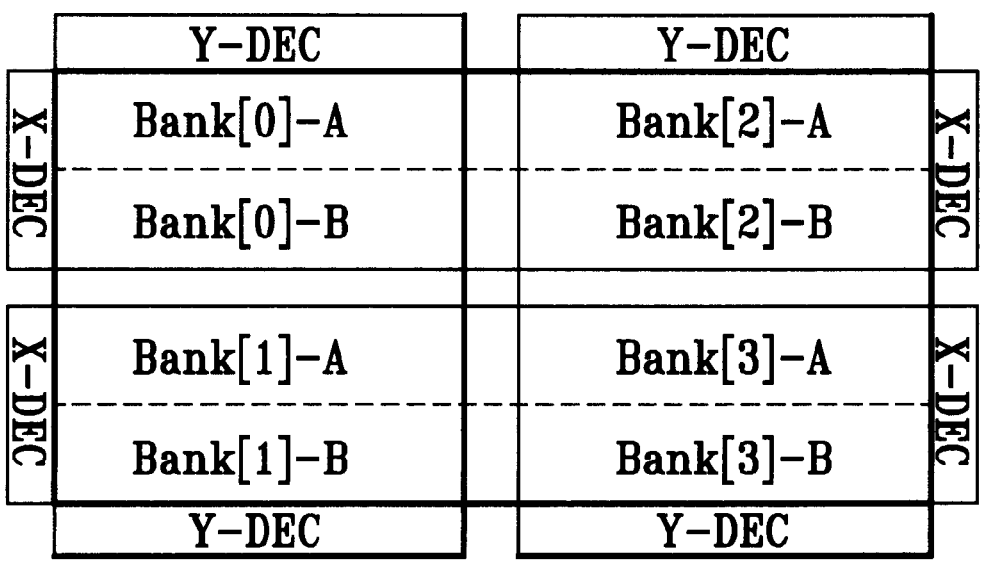
FIG. 10 is a schematic view of a bank according to the embodiment of the present invention.

The length of the block fail signal BFI varies depends on how many blocks a bank is divided into in the memory. If the bank is divided into two blocks as shown in FIG. 10, the block fail signal BFI would be 4 bits long. As the number of blocks increase, the number of bits of the block fail signal BFI also increases.

To select one of blocks A and B in a bank as shown in FIG. 10, the bank address coding unit 45 codes the block fail signal BFI 10 and the BX signals or the AX signals to output the bank address signal BA.

Referring to FIG. 8, if the internal half chip enable signal HEN goes high, the output of the OR gate 62, and thus the input to the second refresh counter $60_1$, goes high as well. A coefficient value of the BX[0] signal is fixed at this juncture, and the BX[1] signal becomes the lowest address bit. As such, a half chip operation is being conducted, since the range of values outputted is reduced by half. A normal half chip operation is performed in response to the refresh enable signal REN by reducing one of the refresh counters.

Referring to FIG. 9, while in half chip operation, i.e. the internal half chip enable signal HEN is high, the output of the AND gate 72 goes low. Accordingly, the first switch $70_0$ always selects the AX[0] while in half chip operation.

Also during the half chip operation, if the refresh is not carried out, i.e. the REN signal is not enabled, the remaining switches $70_1$ to $70_{n-1}$ also selects AX[1]–AX[n–1] from the address buffer 43, and the bank address coding unit codes the entire AX signal and the block fail signal BFI to output the bank address BA.

On the other hand, if the refresh is performed during the half chip operation, the address switching unit 44 outputs the AX[0] signal from the address buffer 43 and the BX[1] to BX[n–1] signals from the refresh counting unit 42. The bank address coding unit 45 codes the block fail signal BFI, AX[0], and BX[1]–BX[n–1] to output the bank address BA.

As mentioned above, the circuit for generating an address of a semiconductor memory device according to the present invention has at least the following advantage. The circuit enables detection of errors of various parts of a chip. When the error prone parts are detected, they can be isolated and the non-error parts can be used without discarding the whole chip. This improves the usage yield of the semiconductor memory device and results in production savings.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A circuit for generating an address of a semiconductor memory device, comprising:
    a half chip enable unit receiving a half chip enable signal for allowing a defective memory cell to be constituted by a half chip operation;
    a refresh counting unit generating a refresh address in response to an external refresh enable signal and the half chip enable signal;
    an address buffer receiving an external address and generating an input address;
    an address switching unit selectively outputting one of the refresh address and the input address as an internal address in response to the refresh enable signal and the half chip enable signal;
    a block fail determining unit outputting a block fail signal data indicating a poor memory cell in response to the half chip enable signal; and
    a bank address coding unit generating a bank address using the refresh address and performing a logic operation of output signal of the block fail determining unit and a bank address when the half chip enable signal is enabled in a half chip operation, to output the logic operated signal to a coded bank address of the defected memory cell.

2. The circuit of claim 1, wherein the refresh counting unit includes first to $n^{th}$ refresh counters, all simultaneously enabled by the refresh enable signal to output an n-bit refresh address.

3. The circuit of claim 2, wherein the first refresh counter generates a carry signal $C_0$ and wherein the refresh counting unit includes an OR gate or'ing the carry signal $C_0$ and the half chip enable signal, the output of which is fed to an input of the second refresh counter.

4. The circuit of claim 2, wherein second to carry signals $C_1$ to $C_{n-2}$, generated by the second to n-$1^{th}$ refresh counters, respectively, to be fed to a neighboring refresh counter of higher order bit.

5. The circuit of claim 2, wherein n–1 refresh address bits, from second to $n^{th}$ refresh counters, are output from the refresh counting unit when in the half chip operation.

6. The circuit of claim 5, wherein the carry signal C0 of the first refresh counter and an OR'ed output value of the half chip enable signal are fixed to HIGH during the half chip operation, so that an output value of the second refresh counter is a relatively lowest order bit of the refresh address.

7. The circuit of claim 1, wherein the address switching unit includes first to $n^{th}$ switches collectively outputting the internal address.

8. The circuit of claim 7, wherein the address switching unit further includes:
an inverter inverting the half chip enable signal; and
an AND gate AND'ing the inverted half chip enable signal and the refresh enable signal, wherein the first switch selects as a lowest order bit of the internal address one of a lowest order bit of the refresh address and the input address in response to an output of the AND gate.

9. The circuit of claim 7, wherein the second to $n^{th}$ switches output remaining bits of one of the refresh address and the input address as remaining bits of the internal address bit in response to the refresh enable signal.

10. The circuit of claim 7, wherein the first switch always selects a lowest order bit of the input address when in the half chip operation.

11. The circuit of claim 1, wherein the block fail determining unit stores fail data of a memory cell block, and then outputs the fail data to the bank address coding unit when in the half chip operation.

12. The circuit of claim 1, wherein the bank address coding unit performs logic operation of the bank address and the refresh address or the input address to output a coded bank address during non-half chip operation.

13. The circuit of claim 12, wherein the bank address coding unit performs a logic operation of the bank address and the refresh address to output a coded bank address during refresh operation.

14. The circuit of claim 13, wherein the bank address coding unit performs logic operation of the bank address and the input address to output a coded bank address during non-refresh operation.

* * * * *